(12) United States Patent
Saito

(10) Patent No.: US 7,321,801 B2
(45) Date of Patent: Jan. 22, 2008

(54) AUTOMATIC GAIN ADJUSTMENT DEVICE AND AUTOMATIC GAIN ADJUSTMENT METHOD

(75) Inventor: Yasushi Saito, Saitama (JP)

(73) Assignee: Sony Corporation (JP)

( * ) Notice: Subject to any disclaimer, the term of this patent is extended or adjusted under 35 U.S.C. 154(b) by 144 days.

(21) Appl. No.: 10/813,454

(22) Filed: Mar. 30, 2004

(65) Prior Publication Data

US 2004/0199271 A1    Oct. 7, 2004

(30) Foreign Application Priority Data

Apr. 1, 2003    (JP) ............................ P2003-098480

(51) Int. Cl.
G05B 13/02 (2006.01)
H03L 7/06 (2006.01)
H03D 3/24 (2006.01)

(52) U.S. Cl. .................... 700/37; 327/147; 327/156; 375/373

(58) Field of Classification Search .................. 700/45, 700/37, 32; 375/372, 373; 327/156, 147
See application file for complete search history.

(56) References Cited

U.S. PATENT DOCUMENTS

| 5,072,192 | A | * | 12/1991 | Noguera et al. | ............. 329/325 |
| 5,331,299 | A | * | 7/1994 | Smith | ........................ 333/175 |
| 5,448,203 | A | * | 9/1995 | Matui et al. | ................ 330/149 |
| 5,602,896 | A | * | 2/1997 | Diepstraten | ................ 378/98.7 |
| 6,072,654 | A | * | 6/2000 | Eddy | ........................ 360/77.04 |
| 6,144,261 | A | * | 11/2000 | Goto et al. | .................... 331/17 |
| 6,204,988 | B1 | * | 3/2001 | Codilian et al. | .............. 360/75 |
| 2002/0176333 | A1 | | 11/2002 | Meng-Fu | |

FOREIGN PATENT DOCUMENTS

JP          11024705          1/1999
JP      2000315326 A       11/2000

OTHER PUBLICATIONS

"Phase Shifter: A Nonlinear Circuit for Direct Measurement of Phase Margin in Feedback Control Systems"; Dantowitz, P. et al., Circuits and Systems, proceedings of the 35th Midwest Symposium on Circuits and Systems, (1992), IEEE, vol. 1, pp. 365-368.*
David M Harrison, Michael J Howes, Roger D Pollard: "The Evaluation of Phase Noise in Low Noise Oscillators", Microwave Symposium Digest, MTT-S International, vol. 87, No. 1, Jun. 187 (1987-Jun.), pp. 521-524, XP002434237, Las Vegas, Nevada, USA.

* cited by examiner

*Primary Examiner*—Anthony Knight
*Assistant Examiner*—Jennifer L. Norton
(74) *Attorney, Agent, or Firm*—Lerner, David, Littenberg, Krumholz & Mentlik, LLP

(57) ABSTRACT

An automatic gain adjustment device and method capable of accurately adjusting a gain with a simple structure. In an automatic gain adjustment method of a feedback control system that uses a phase difference between an output signal obtained from a controlled object and an input signal while controlling the object based on the input signal, a phase shift amount is set to cause a frequency of the input signal to coincide with the crossover frequency at which the open loop gain forming the feedback control system becomes 0 dB, and a phase of the input signal is shifted based on the phase shift amount.

4 Claims, 7 Drawing Sheets

AUTOMATIC GAIN ADJUSTMENT DEVICE AND AUTOMATIC GAIN ADJUSTMENT METHOD

BACKGROUND OF THE INVENTION

1. Field of the Invention

The present invention relates to an automatic gain adjustment device and automatic gain adjustment method, and more particularly, is suitably applied to an optical disc device, for example.

2. Description of the Related Art

In optical disc devices of this kind, methods using a signal phase, signal amplitude or the like are employed in order to automatically carry out gain adjustment of a feedback control system which is used in a servo control circuit such as a focus servo or tracking servo.

For the automatic gain adjustment method using a signal phase, a phase comparison technique using a phase comparator in a servo loop has been proposed to realize the automatic gain adjustment (refer to, for example, Japanese Patent Laid-Open No. 11-24705 (page 4, FIG. 3))

FIG. 1 shows a concrete example of a gain adjustment circuit 1 which has been conventionally used. In the gain adjustment circuit 1, a disturbance signal S1 which is a sine wave and composed of a predetermined single frequency generated in a disturbance generator 2 is supplied to one input port of a phase comparator 3, and at the same time, supplied to a feedback control system 5 via an adder 4.

The feedback control system 5 is a closed circuit including a compensator 6, amplifier 7 and controlled object 8 (actuator drive system, etc.). After being phase-compensated by the compensator 6, the disturbance signal S1 to be supplied is amplified by an amplifier 7 to cause the object 8 to be controlled, and to output a signal S2 that is to return to the adder 4. In this manner, feedback control is carried out in the feedback control system 5.

The output signal S2 of the controlled object 8, which is an output of the feedback control system 5, is supplied to a band-pass filter (BPF) 9. The band-pass filter 9 extracts the same frequency band component as that of the disturbance signal S1 from the output signal S2 of the controlled object 8. The extracted frequency band component is then supplied to the phase comparator 3 via the other input port thereof. After comparing phases of the inputted signals S1 and S3, the phase comparator 3 supplies a gain setting unit 10 at the next stage with the comparison results. The gain setting unit 10 adjusts in real time a gain of the amplifier 7 in the feedback control system 5 based on the comparison results obtained from the phase comparator 3 such that a phase difference, which is the comparison result, falls within a certain range.

A gain of the feedback control system is defined by frequency transfer function in general. It is ideally desirable that a gain of the amplifier in the open loop be adjusted such that an actual gain becomes 0 dB at the frequency (hereinafter referred to as a crossover frequency) where an open loop gain of the feedback control system becomes 0 dB.

As shown in FIG. 1, in a case where the disturbance signal S1 is set at a crossover frequency fc and supplied from the disturbance generator 2 to the feedback control system 5, the open loop gain determined by the compensator 6, amplifier 7 and controlled object 8 in the feedback control system 5 is represented by Y/X, where signal amplitudes at point A, X and Y are A, X, and Y, respectively.

Assuming that the open loop gain Y/X is G, a closed loop gain determined by the adder 4, compensator 6, amplifier 7 and controlled object 8 in the feedback control system 5 is represented by Y/A, which can be represented by G/(1+G) by using G.

When the gain adjustment is carried out with the disturbance signal S1 that has been set at the crossover frequency fc output from the disturbance generator 2, since the open loop gain G and closed loop gain G/(1+G) differ from each other as described above, the closed loop gain G/(1+G) at the crossover frequency fc becomes 0 dB. On the other hand, the open loop gain G does not become 0 dB.

Accordingly, it is necessary that a signal having a crossover frequency f'c be output from the disturbance generator 2 in order for the open loop gain G to become 0 dB at the crossover frequency fc. This involves additional steps of calculating the crossover frequency f'c from an actual measurement and the like previously.

When the open loop gain G does not become 0 dB at the crossover frequency fc after completion of the gain adjustment, an additional gain adjustment needs to be carried out with the crossover frequency f'c changed. In this case, also a frequency band of the band-pass filter 9 must be changed.

Further, phases of the two signals S1 and S3 must be detected for comparison by the phase comparator 3. However, actual signals contain noises and the like, with the result that it has been difficult to accomplish accurate detection of the phases.

SUMMARY OF THE INVENTION

In view of the foregoing, an object of this invention is to provide a device and method for automatically adjusting a gain which are capable of accurately adjusting a gain with a simple structure.

The foregoing objects and other objects of the invention have been achieved by the provision of an automatic gain adjustment device of a feedback control system which uses a phase difference between an output signal obtained from a controlled object and an input signal while controlling the object based on the input signal. In this automatic gain adjustment device, a phase shifting means is connected to an input stage of the feedback control system to shift a phase of the input signal, and a phase shift amount of the phase shifting means is set such that a frequency of the input signal to be supplied to a closed loop coincides with a crossover frequency at which an open loop gain forming the feedback control system becomes 0 dB.

As a result, in the automatic gain adjustment device, a frequency of the input signal to be supplied to the closed loop can automatically coincide with the crossover frequency at which the open loop gain forming the feedback control system becomes 0 dB.

Further, in an automatic gain adjustment device for a feedback control system according to the present invention which uses a phase difference between an output signal obtained from a controlled object and an input signal while controlling the object based on the input signal, a phase shift amount is set such that a frequency of the input signal to be supplied to a closed loop coincides with a crossover frequency at which an open loop gain forming the feedback control system becomes 0 dB, and then a phase of the input signal is shifted based on the phase shift amount.

As a result, with the automatic gain adjustment method, a frequency of the input signal to be supplied to the closed loop can automatically coincide with the crossover frequency at which the open loop gain forming the feedback control system becomes 0 dB.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of this invention will be described with reference to the accompanying drawings:

(1) First Embodiment

(1-1) Configuration of Optical Disc Reproducing Apparatus

Figure 2:
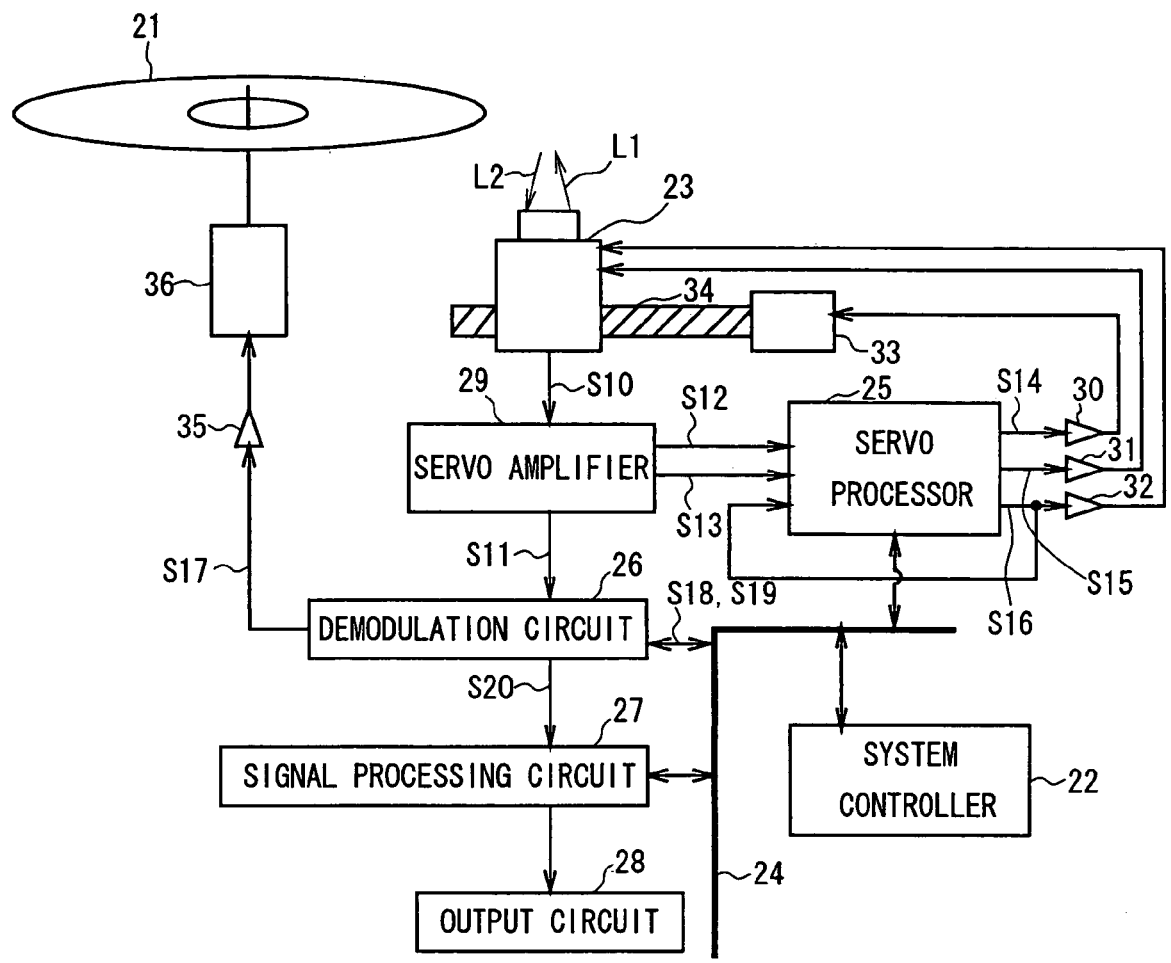
FIG. 2 is a block diagram showing a configuration of an optical disc reproducing apparatus according to a first embodiment.

In FIG. 2, reference numeral 20 denotes an optical disc reproducing apparatus according to a first embodiment. The optical disc reproducing apparatus 20 is configured to reproduce e.g., video and audio data from an optical disc 21 such as a digital versatile disc (DVD).

More specifically, during playback of data in the optical disc reproducing apparatus 20, a system controller 22 for controlling the entire system rotates/drives the optical disc 21 at a predetermined speed. At the same time, the system controller 22 allows an optical pickup 23 to irradiate the optical disc 21 with a light beam L1, and moves a beam spot of the light beam L1 (hereinafter referred to merely as beam spot) in a radial direction of the optical disc 21 along the data track thereof. Further, the system controller 22 controls the system to allow the optical pickup 23 to execute a tracking control and focusing control.

A system controller 22 is connected to a servo processor 25, demodulation circuit 26, signal processing circuit 27 and output circuit 28 via a bus 24, and configured to control the circuits 25 to 28 as needed to allow the circuits to execute various operations.

The optical pickup 23 includes optical system devices (not shown) such as a laser diode, collimator lens, objective lens and light-receiving element, and electrical system devices (not shown) such as a laser diode driver. When the system controller 22 drives the laser diode via the servo processor 25, the light beam L1 is irradiated to the optical disc 21.

The light beam L1 is then reflected by a recording surface of the optical disc 21 to become a reflecting light L2. An RF signal S10 obtained based on the reflecting light L2 is supplied from the optical pickup 23 to a servo amplifier 29. The servo amplifier 29 transmits a digitized signal S11, which is obtained by digitizing the inputted RF signal S10, to the demodulation circuit 26, generates a tracking error signal S12 and focus error signal S13, and transmits these signals to a servo processor 25.

The servo processor 25 generates a tracking drive signal S14 based on the tracking error signal S12 to drive a tracking actuator (not shown) included in the optical pickup 23 via an amplifier 30, thereby attaining the tracking control. The servo processor 25 also generates a focus drive signal S15 based on the focus error signal S13 to drive a focus actuator (not shown) included in the optical pickup 23 via an amplifier 31, thereby attaining the focus control.

Further, the servo processor 25 extracts low frequency components from the tracking error signal S12 and generates a thread drive signal S16 to drive a stepping motor 33 via an amplifier 32, thereby moving the beam spot on the optical disc 21 in a radial direction of the optical disc 21 along the data track (pregroove or land) formed on the recording surface thereof while rotating a lead screw 34.

The demodulation circuit 26 generates a spindle error signal S17 based on the supplied digitized signal S11 to control a spindle motor 36 via an amplifier 35, thereby rotating/driving the optical disc 21 at a predetermined speed.

The demodulation circuit 26 decodes the supplied digitized signal S11 to detect an actual absolute address of the beam spot on the optical disc 21 and transmit it to the system controller 22. More specifically, the demodulation circuit 26 allows the digitized signal S11 to pass through a band-pass filter circuit (not shown) that is disposed therein and allows only a predetermined frequency band component to pass, thereby extracting a wobble component contained in the digitized signal S11. The demodulation circuit 26 then subjects the wobble component to FM demodulation to detect the actual absolute address at which the beam spot irradiated to the optical disc 21 is placed, and transmits it to the system controller 22 as sector address information S18.

Further, the demodulation circuit 26 transmits a sync interruption signal S19 which indicates a change of the absolute address on the optical disc 21 obtained by the decoding processing as above, to the system controller 22 every time the absolute address is changed, that is, every time the sector that the beam spot irradiated to the optical disc 21 scans is changed.

When receiving the address information signal S18 and sync interruption signal S19 from the demodulation circuit 26, the system controller 22 sequentially recognizes the actual playback position on the optical disc 21, and executes a necessary control processing on the basis of the recognition results so that the data is properly reproduced from the optical disc 21.

The demodulation circuit 26 decodes the supplied digitized signal S11 to obtain a sector data information signal S20 representing contents such as video and sound recorded on the optical disc 21, and transmits the signal S20 to the signal processing circuit 27. Based on the sector data information signal 20, the signal processing circuit 27 generates a video signal and audio signal having the same original formats as those before being recorded, and transmits them to the output circuit 28 having a monitor, speaker, external terminal and the like.

As described above, the optical disc reproducing apparatus 20 can reproduce the data recorded on the optical disc 21 to transmit the data to external devices such as a monitor for displaying images or speaker for producing a sound, as desired.

(1-2) Internal Configuration of Servo Processor

Figure 1:
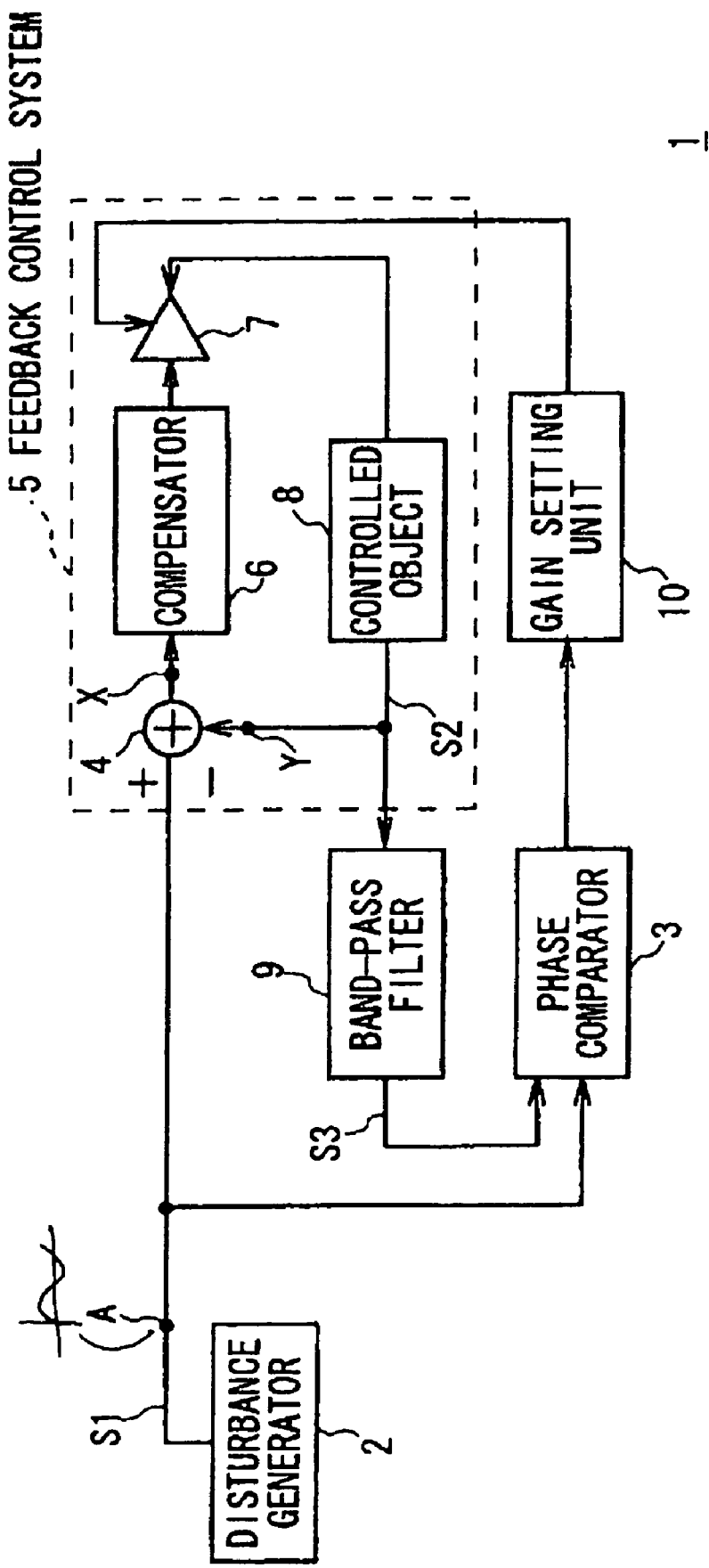
FIG. 1 is a block diagram showing a configuration of a conventional gain adjustment circuit.
Figure 3:
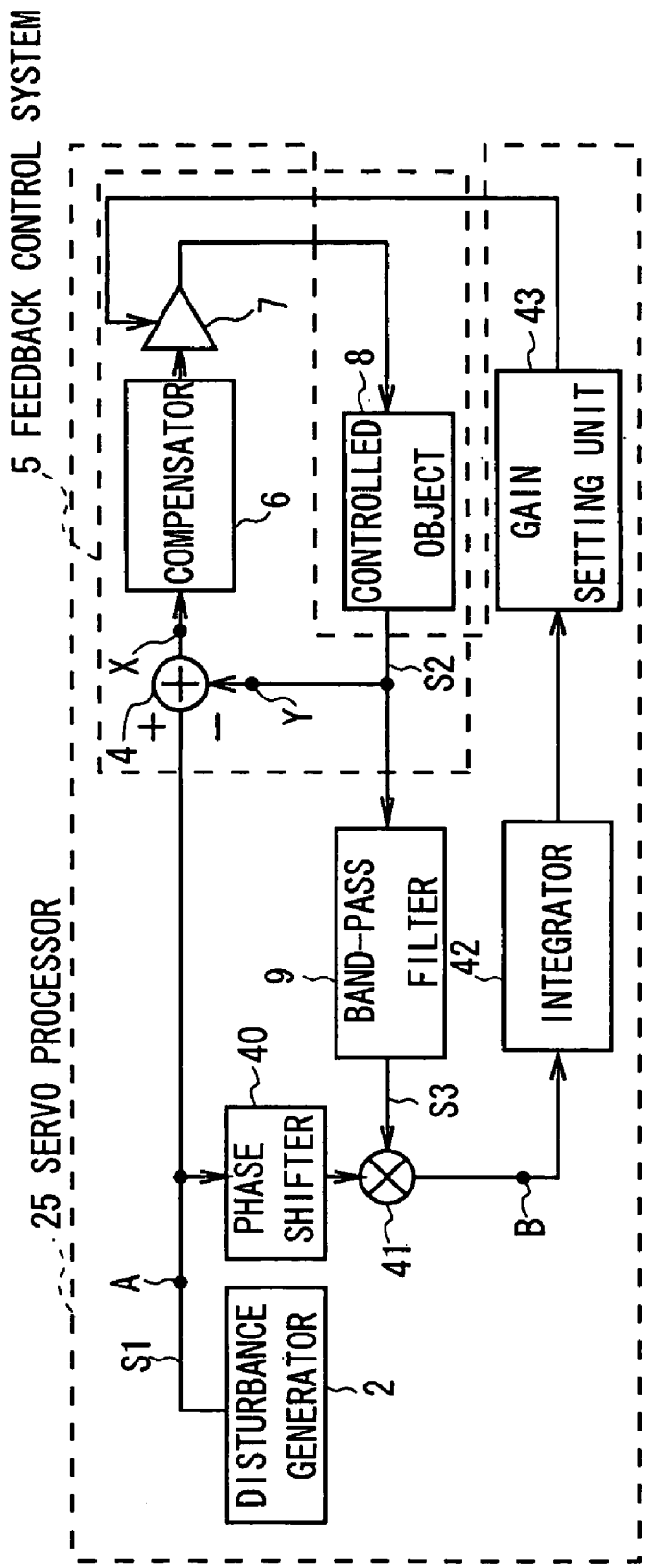
FIG. 3 is a block diagram showing an internal configuration of a servo processor according to the first embodiment.

The configuration of the servo processor 25 shown in FIG. 3 in which the same parts as those in FIG. 1 are indicated by the same reference numerals is the same as the above-described conventional gain adjustment circuit 1, except for the following points: disposing a phase shifter 40 at an output stage of the disturbance generator 2 in parallel with the adder 4; disposing, in place of the phase comparator 3, a multiplier 41 for multiplying outputs of the phase shifter 40 and band-pass filter 9, and an integrator 42 for integrating multiplying results of the multiplier 41; not including the controlled object 8; and changing an internal configuration of the gain setting unit 43.

The controlled object 8 removed from the servo processor 25 in FIG. 3 corresponds to the optical pickup 23 and servo amplifier 29 in the above-described optical disc reproducing apparatus 20. While each of the focus, tracking, thread and spindle servo loops constitutes a feedback control system in the optical disc reproducing apparatus 20, only the focus servo loop and tracking servo loop are assumed to be targets of automatic gain adjustment in the present invention.

In the servo processor 25, the disturbance signal S1 which is a sine wave and composed of a predetermined single frequency generated in the disturbance generator 2 is supplied to the phase shifter 40 and at the same time supplied to the feedback control system 5 via the adder 4.

The phase shifter 40 phase-shifts the supplied disturbance signal S1 so that the open loop gain becomes 0 dB and then transmits the phase-shifted signal Si to the multiplier 41.

In the feedback control system 5, after being phase-compensated by the compensator 6, the supplied disturbance signal S1 is then amplified by the amplifier 7 and output via the controlled object. 8.

An output signal S2 of the controlled object 8, which is an output of the feedback control system 5, is supplied to the band-pass filter (BPF) 9. The band-pass filter 9 extracts the same frequency-band component as that of the disturbance signal S1 from the output signal S2 of the controlled object 8 and transmits the component to the multiplier 41.

The multiplier 41 multiplies the disturbance signal S1 that has been phase-shifted by the phase shifter 40 and an output S3 of the band-pass filter 9. Results of the multiplying of the multiplier 41 are integrated by the integrator 42 at the next stage.

Based on an output of the integrator 42, the gain setting unit 43 detects a sign of the output, and based on the detected sign, increases or decreases a gain of the amplifier 7 in the feedback control system 5, thereby adjusting the gain of the amplifier 7.

(1-3) Phase Shift Amount of Phase Shifter and Relation Between Sign of Integrator and Gain In the following, a derivation of the phase to be set in the phase shifter 40 and a relation between the sign of the integrator 42 and open loop gain at the crossover frequency will be described.

Figure 4:
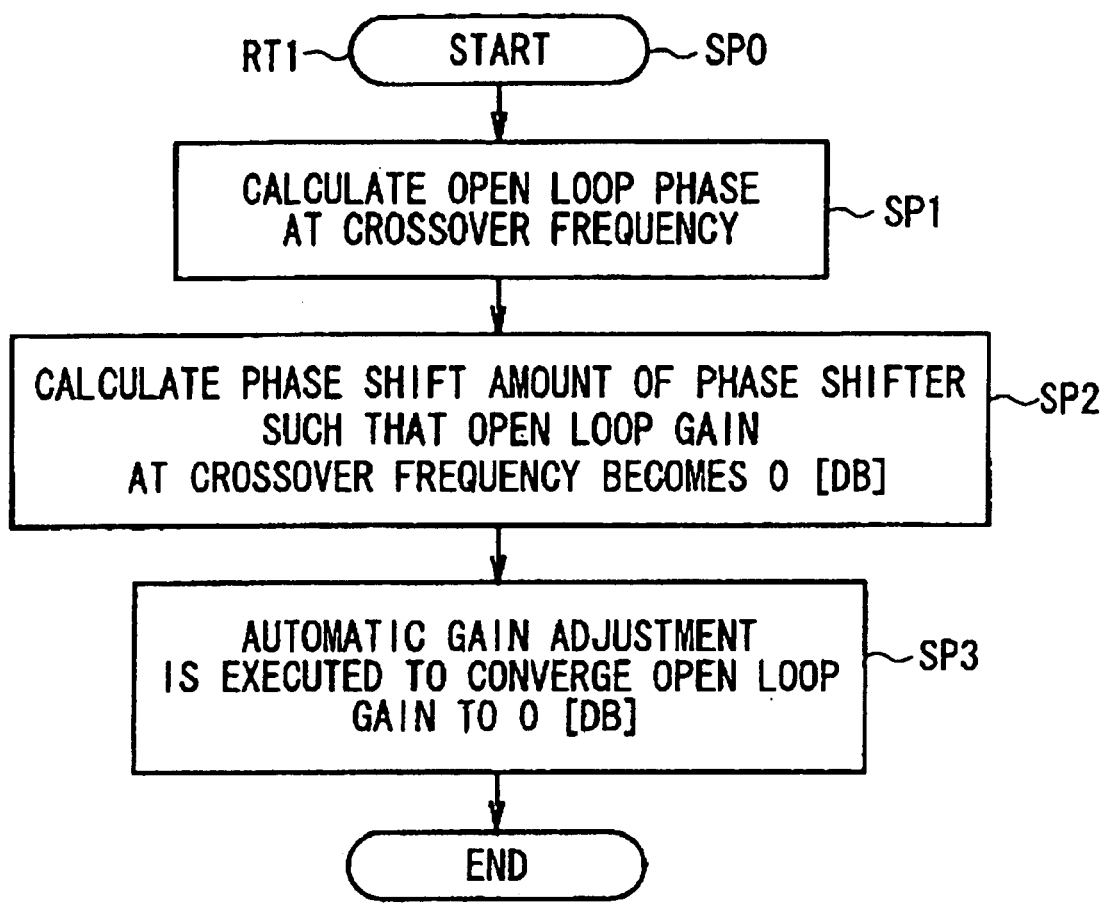
FIG. 4 is a flowchart to help explain an automatic gain adjustment routine.

A relation between the open loop gain, open loop phase and closed loop phase is calculated in the feedback control system of FIG. 3 including the controlled object (step SP1 in FIG. 4). The open loop frequency transfer characteristic G(jθ) in the feedback control system can be represented by the following equation, assuming that the amplitude is g(θ) and phase is exp(jθ).

$$G(j\theta) = g(\theta) \cdot \exp(j\theta) \quad (1)$$

As shown in the above equation, the open loop frequency transfer characteristic can be represented by the product of the amplitude and phase. Here, j and θ represent imaginary unit and phase, respectively, and the following equation $$g(\theta) = |G(j\theta)| \quad (2)$$

is assumed to represent amplitude g(θ).

With the above equations (1) and (2), the following equation $$G'(j\theta) = \frac{G(j\theta)}{1 + G(j\theta)} \quad (3)$$

$$= \frac{g(\theta)\exp(j\theta)}{1 + g(\theta)\exp(j\theta)}$$

$$= g(\theta) \cdot \frac{\cos\theta + g(\theta) + j\sin(\theta)}{1 + 2g(\theta)\cos\theta + g^2}$$

can represent the closed loop frequency transfer characteristic G'(jθ).

The disturbance signal S1 at the point A in the servo processor 25 shown in FIG. 3 is assumed to be a sin(ωt), where a, ω, and t represent amplitude, angular frequency, and time, respectively. The signal S2 at the point Y is assumed to be a' sin(ωt−φ), where a' and φ represent amplitude and phase, respectively.

Based on the above equation (3), the amplitude a' can be represented by the following equation.

$$a' = \frac{g}{\sqrt{1 + 2g\cos\theta + g^2}} \quad (4)$$

The phase φ can be represented by the following equation.

$$\tan\phi = \frac{\sin\theta}{g + \cos\theta} \quad (5)$$

Here, g is assumed to be equal to g(θ), as a matter of convenience.

In this manner, the relation between the open loop gain g, open loop phase θ and closed loop phase φ can be calculated from the above equation (5).

Next, in the servo processor 25, the phase shift amount is calculated with respect to the disturbance signal S1 inputted to the phase shifter 40 such that the open loop gain g becomes 1, that is, 0 dB (step SP2 in FIG. 4).

Assuming that the phase shift amount in the phase shifter 40 is (ξ−π/2) with a quadrature component taken into consideration, an output signal of the phase shifter 40 is a cos(ωt−ξ). Accordingly, assuming that an output signal of the multiplier 41 at the point B is f(ωt), the following equation $$f(\omega t) = a' \sin(\omega t - \phi) \cdot a\cos(\omega t - \xi) \quad (6)$$

-continued $$= \frac{aa'}{2} \cdot \{\sin 2\omega t \cdot \cos(\xi + \phi) -$$
$$\cos 2\omega t \cdot \sin(\xi + \phi) + \sin(\xi - \phi)\}$$

can be obtained.

For the integrator 42, assuming that the value obtained by integrating the function f(t) from the time=0 to 1 cycle is output-value I, since both the first and second terms of the right side of the equation (6) are 0, the output-value I can be represented by the following equation.

$$I = \int_0^T f(\omega t) \tag{7}$$
$$= \frac{aa'}{2}\sin(\xi - \phi)\int_0^T dt$$
$$= -\frac{\pi aa'}{\omega}\sin(\phi - \xi)$$

Here, ω, a and a' are each greater than 0 (ω>0, a>0, a'>0). Thus, the following inequalities when $0 \leq \phi - \xi < \pi$, $I \leq 0$ when $-\pi < \phi - \xi \leq 0$, $I \geq 0$ (8)

represent the relationship between the phase value (φ-ξ) and output value I of the integrator 42.

The above inequalities (8) show that whether the phase (φ-ξ) is plus or minus depends on the sign (plus or minus) of the output value I of the integrator 42.

If the gain agrees with the adjusted value, the output value I of the integrator 42 becomes 0. In this case, the phase (φ-ξ) also becomes 0, with the result that the equation (5) can be represented also as the following equation.

$$\tan\xi = \frac{\sin\theta}{g + \cos\theta} \tag{9}$$

Assuming that open loop gain g=1, the equation (9) can be represented by the following equation:

$$\tan\xi = \frac{\sin\theta}{1 + \cos\theta} \tag{10}$$

The ξ of the phase shift amount (ξ-π/2) of the phase shifter 40 is set so as to satisfy the following equation.

$$\xi = \arctan\frac{\sin\theta}{1 + \cos\theta} \tag{11}$$

According to the above equation (11), the open loop gain g becomes 1, that is, 0 dB.

Subsequently, in the servo processor 25, the relationship between the sign of the output value I of the integrator 42 and open loop gain g is calculated (step SP3 in FIG. 4). Based on the above equation (5), the open loop gain g can be represented by the following equation:

$$g = \frac{\sin\theta}{\tan\phi} - \cos\theta \tag{12}$$

In this case, assuming that "η=φ-ξ", the equation (12) can be represented by the following equation:

$$g = \frac{\sin\theta}{\tan(\eta + \xi)} - \cos\theta \tag{13}$$

If the equation (13) is differentiated by η, the following equation $$\frac{dg}{d\eta} = \sin\theta \cdot \frac{1}{-\tan^2(\eta + \xi)} \cdot \frac{1}{\cos^2(\eta + \xi)} = -\frac{\sin\theta}{\sin^2(\eta + \xi)} \tag{14}$$

can be obtained.

In the vicinity of frequency f'c, the relationship "sin θ<0" is satisfied based on the relationship "-π<θ<0". Further, the relationship "dg/dη>0" is satisfied based on $\sin^2(\eta+\xi)>0$.

As described above, in a case where the output value I of the integrator 42=0, the phase (φ-η)=0 and open loop gain g=1. Accordingly, if η=0, the open loop gain g=1. Since the rate of change in the equation (13) is plus, the relationship between η and g can be represented by the following inequalities.

when η>0(φ>ξ), g>1 when η<0(φ<ξ), g<1 (15)

Further, based on the above inequalities (8) and (15), the relationship as represented by the following inequalities when I<0, g>1 when I>0, g<1 (16)

can be obtained

The above inequalities (16) show the relationship between the sign of the output value I of the integrator 42 and open loop gain g. Consequently, the gain adjustment in the servo processor 25 shown in FIG. 3 should be carried out as follows. In a case where the output value I of the integrator 42 is less than 0 (I<0), the open loop gain g is greater than 1 (g>1), so that the gain of the amplifier 7 should be decreased. On the other hand, when the output value I of the integrator 42 is greater than 0 (I>0), the open loop gain g is less than 1 (g<1), so that the gain of the amplifier 7 should be increased.

That is, the gain setting unit 43 sets the gain of the amplifier 7 such that the output value I of the integrator 42 becomes 0 by increasing/decreasing the gain of the amplifier 7 depending on the sign of the output value I of the integrator 42, with the result that open loop gain g becomes 1.

(1-4) Gain Adjustment Routine RT1

The actual gain adjustment is executed starting from the step SP0 according to the gain adjustment routine RT1 shown in FIG. 4, which enables an accurate automatic gain adjustment with a simple structure and without a need for an actual measurement of the frequency of the disturbance signal S1.

First, the open loop phase at the crossover frequency is calculated (step SP1), and then the phase shift amount of the phase shifter 40 is calculated according to the equation (10) such that the open loop gain at the crossover frequency becomes 0 dB (step SP2).

Next, the servo processor 25 automatically executes the gain adjustment with respect to the feedback control system 5 of FIG. 3 including the controlled object 8, thereby making the open loop gain g equal to 1, that is, converging it to 0 dB (step SP3 in FIG. 4).

Figure 5:
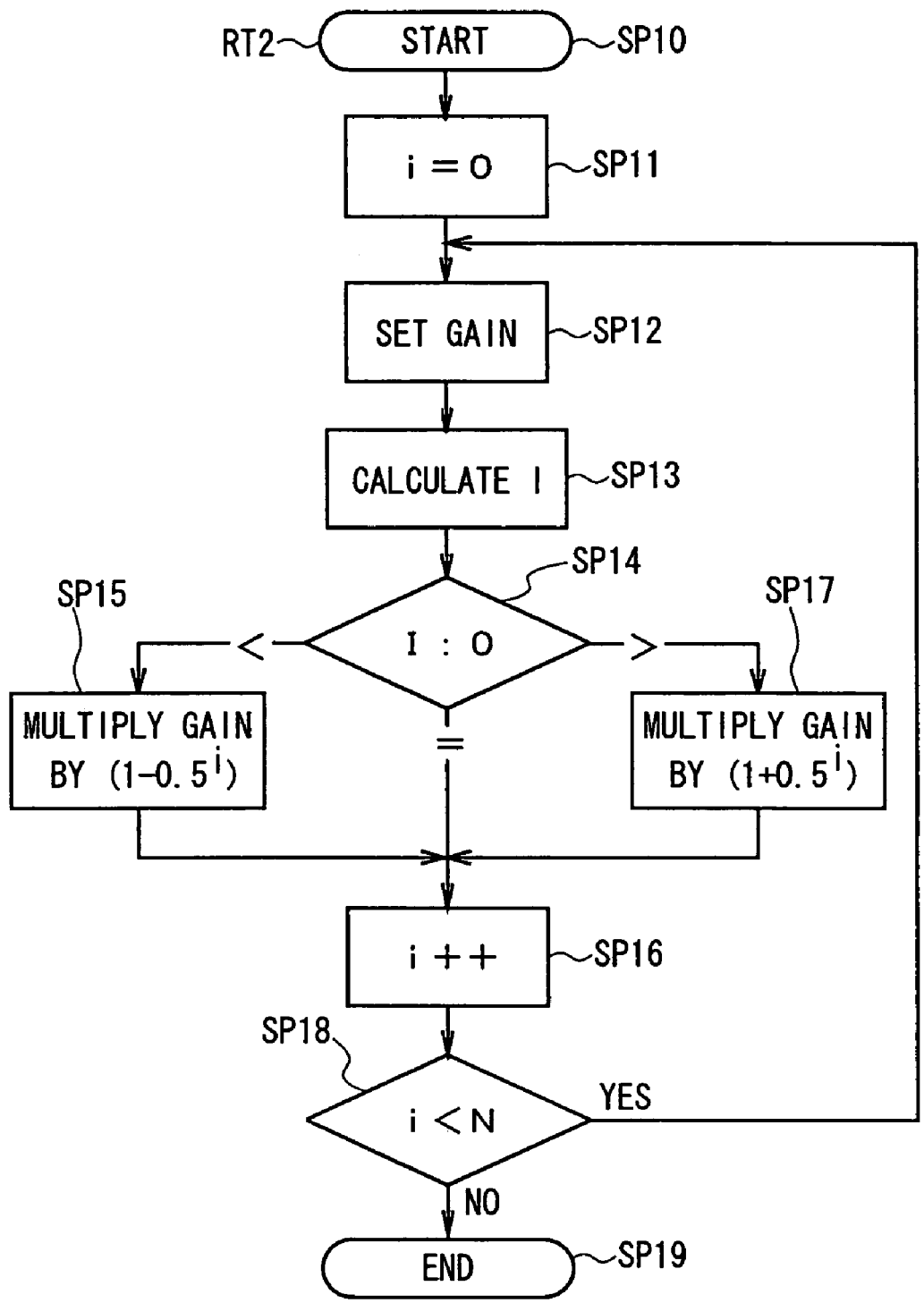
FIG. 5 is a flowchart to help explain a gain convergence routine according to bisection method.

FIG. 5 shows the gain convergence routine RT2 using so-called bisection method. The routine RT2 is executed starting from SP10, and subsequent steps including SP11 to SP18 are repeated N times to converge the gain. Here, N represents number of times needed to converge the open loop gain g with appropriate accuracy, and i ($\geq$N) represents i-th operation.

First, stating from 0-th operation (i=0) in step SP11, followed by setting the gain in such a manner to supply the feedback control system with the disturbance signal S1 in step SP12. Thereafter, the output value I of the integrator 42 is calculated in step SP13.

Subsequently, in step SP14, three different processings are made based on the sign of the output value I of the integrator 42. That is, when the output value I has a plus sign (I>0), the gain of the amplifier 7 is multiplied by $(1+0.5^i)$ in step S17, and the flow advances to step SP16. When the output value I has a minus sign (I<0), the gain of the amplifier 7 is multiplied by $(1-0.5^i)$ in step SP15, and the flow advances to step SP16. When the output value I is equal to 0 (I=0), no processing is made and the flow advances to step SP16.

The value of i is incremented in step SP16, followed by determining whether the value of i is less than N in step SP18. If so, the flow returns to step SP12 and the same processing is repeated. Finally, a negative result has been obtained in step SP18, which means that the value of i has reached N, that is, the gain has been converged, and the flow advances to the step SP19 to end the gain convergence routine RT2.

Assuming that an initial gain of the amplifier 7 has been multiplied by r as a result of the gain adjustment described above, r can be represented by the following equation.

$$r = 1 + \sum_{i=1}^{N} 0.5^i a_i \quad (17)$$

when $I < 0$, $a_i = -1$ when $I > 0$, $a_i = +1$ when $I = 0$, $a_i = 0$

Figure 6:
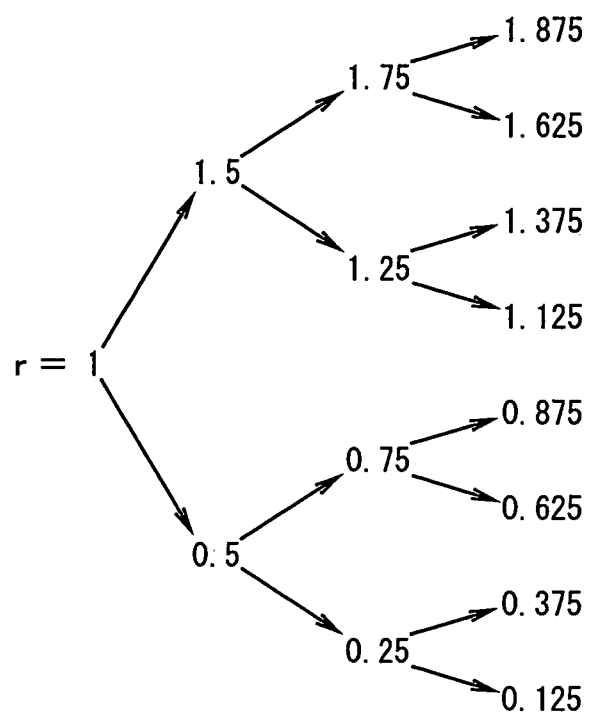
FIG. 6 is a schematic diagram to help explain a gain magnification according to the bisection method.

The change in the value of r is shown in FIG. 6.

(1-5) Operations and Effects of First Embodiment

As described above, in the servo processor 25 of the optical disc reproducing apparatus 20, the relationship with respect to the open loop phase at crossover frequency which forms the feedback control system 5 is calculated, and then the phase shift amount with respect to the disturbance signal S1 that has been input to the phase shifter 40 is calculated such that the open loop gain becomes 0 dB.

Subsequently, the servo processor 25 converges the open loop gain to 0 dB by increasing/decreasing the gain of the amplifier 7 based on the sign of the output value of the integrator 42, thereby causing a frequency of the disturbance signal S1 to automatically coincide with the crossover frequency at which the open loop gain of the feedback control system 5 becomes 0 dB.

Therefore, in the servo professor 25, it is not necessary that the crossover frequency at which the open loop gain of the feedback control system 5 becomes 0 dB be actually measured and outputted from the disturbance generator 2 as the frequency of the disturbance signal S1, with the result that time and labor at manufacturing time can be prevented. In addition, there is no need to change a frequency band of the band-pass filter 9 to be supplied with the output from the feedback control system 5.

Further, in the servo professor 25, the multiplier 41 and integrator 42 are combined for use in place of the conventional phase comparator, so that it becomes unnecessary to extract a phase from the signal with high noise. Therefore, a gain adjustment can be carried out with high accuracy.

According to the above configuration, in the servo processor 25 of the optical disc reproducing apparatus 20, the phase shifter 40 is disposed at the output stage of the disturbance generator 2 in parallel with the adder, the phase shift amount with respect to the disturbance signal S1 that has been input to the phase shifter 40 is calculated such that the open loop gain becomes 0 dB, and the gain of the amplifier 7 is adjusted based on the sign of the output value of the integrator 42, thereby causing a frequency of the disturbance signal S1 to automatically coincide with the crossover frequency at which the open loop gain of the feedback control system 5 becomes 0 dB. In this manner, the servo processor 25 capable of accurately adjusting the gain can be realized with a simple structure.

(2) Second Embodiment

The configuration of the optical disc reproducing apparatus (not shown) according to a second embodiment is the same as that of the optical disc reproducing apparatus 20 (FIG. 2) according to the first embodiment except for the configuration of the servo processor.

Figure 7:
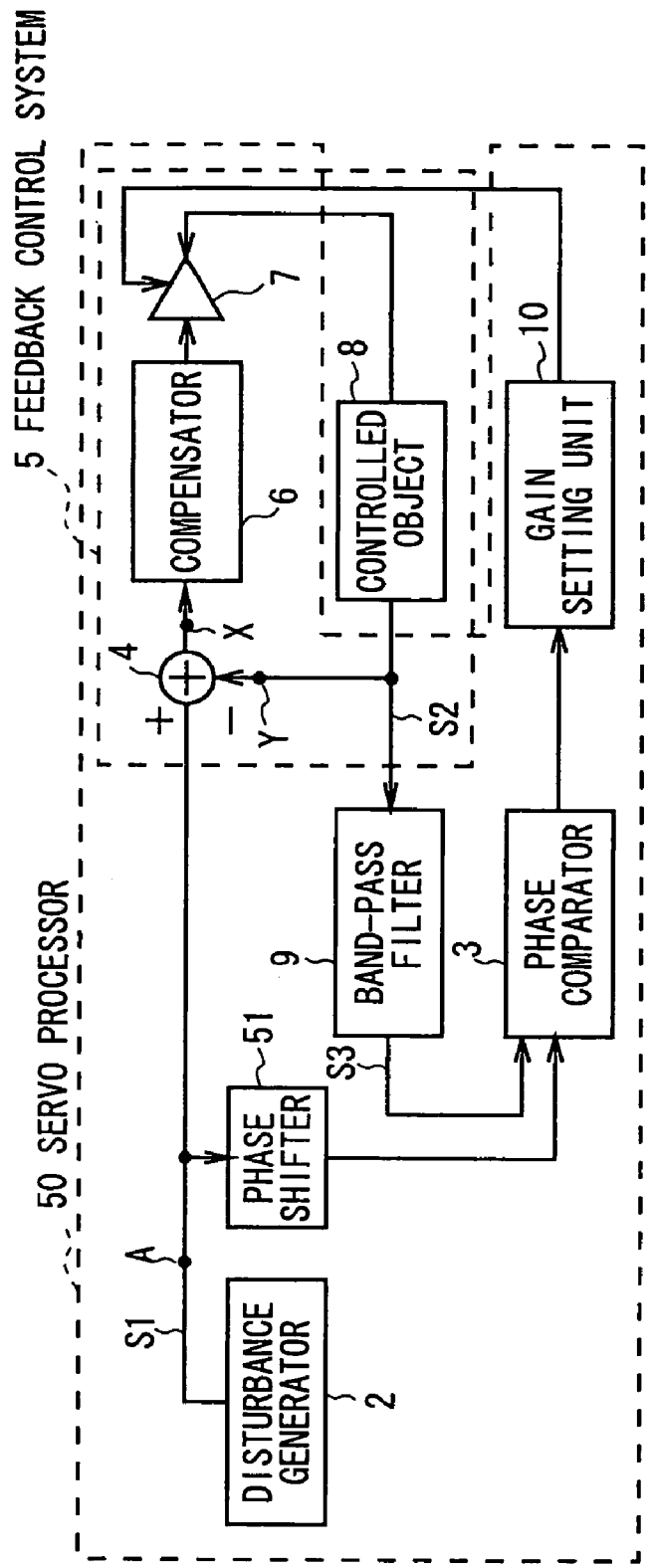
FIG. 7 is a block diagram showing an internal configuration of a servo processor according to a second embodiment.

As shown in FIG. 7 in which the same parts as those in FIG. 1 are indicated by the same reference numerals, the configuration of the servo processor 50 according to the second embodiment is the same as that of the conventional gain adjustment circuit 1 except that a phase shifter 51 is disposed at an output stage of the disturbance generator 2 in parallel with the adder 4.

In the servo processor 50 of FIG. 7, a phase shift amount of the phase shifter 51 can be represented by $\xi$ since there is no need to taking the quadrature component $\pi/2$ into consideration due to absence of the multiplier at the next stage.

According to the above configuration, in the servo processor 50 of the optical disc reproducing apparatus, the phase shifter 51 is disposed at the output stage of the disturbance generator 2 in parallel with the adder, the phase shift amount with respect to the disturbance signal S1 that has been input to the phase shifter 51 is calculated such that the open loop gain becomes 0 dB, and the gain of the amplifier 7 is adjusted in accordance with a progress of the phase based on the output from the phase comparator 3, thereby causing a frequency of the disturbance signal S1 to automatically coincide with the crossover frequency at which the open loop gain of the feedback control system 5 becomes 0 dB. In this manner, the servo processor 50 capable of accurately adjusting the gain can be realized with a simple structure.

(3) Another Embodiments

As described above, the present invention is applied to the optical disc reproducing apparatus 20 compatible with DVD in the first and second embodiment. Alternatively, however, the present invention can be applied to other different kinds of reproducing apparatuses that are compatible with optical discs such as a compact disc (CD). Further, the present invention can be applied not only to the reproducing apparatuses, but to other different kinds of recording apparatuses compatible with various types of disc-type recording media including writable optical discs such as a DVD-R, DVD-RW, CD-R, CD-RW or the like, and magnetic optical discs such as a magneto optical disc (MO).

As described above, the automatic gain adjustment device of the feedback control system 5 which uses the phase difference between the output signal S3 obtained from the controlled object 8 controlled based on the disturbance signal S1 (input signal) and the input signal S1 is applied to the servo processors 25 and 50 of the optical disc reproducing apparatus 20, in the first and second embodiments. Alternatively, however, the above automatic gain adjustment device can be widely applied to other different kinds of automatic gain adjustment devices.

Further, in the first and second embodiments, the phase shifters (phase shifting means) 40 and 51 which are connected to the input stage of the feedback control system 5 and shift the phase of the disturbance signal (input signal) S1 are disposed to set the phase shift amount of the phase shifters (phase shifting means) 40 and 51 based on the disturbance signal (input signal) S1 so as to cause the frequency of the disturbance signal (input signal) S1 to coincide with the crossover frequency at which the gain of the open loop forming the feedback control system 5 becomes 0 dB. However, the present invention is not limited to this, and other kinds of configurations may be used as long as they can obtain the phase shift amount by computation.

Furthermore, in the first embodiment, the multiplier 41 for multiplying the disturbance signal (input signal) S1 and output signal S3 of the controlled object 8 and the integrator 42 for integrating multiplying result of the multiplier 41 are disposed to converge the open loop gain to 0 dB by adjusting the gain of the feedback control system 5 based on the sign of the output value of the integrator 42. However, the present invention is not limited to this, and various kinds of configurations other than the combination of the multiplier and integrator may be used unless they involve a processing of extracting the phase from the signal with high noise.

In this case, bisection method is used to converge the open loop gain to 0 dB. However, the present invention is not limited to this, and other kinds of methods may be used as far as they can converge the open loop gain to 0 dB.

As described above, according to the present invention, in an automatic gain adjustment device of a feedback control system which uses a phase difference between an output signal obtained from a controlled object and an input signal while controlling the object based on the input signal, a phase shifting means is connected to an input stage of the feedback control system to shift a phase of the input signal, and a phase shift amount of the phase shifting means is set such that a frequency of the input signal coincide with a crossover frequency at which an open loop gain forming the feedback control system becomes 0 dB, thereby causing a frequency of the input signal to automatically coincide with the crossover frequency at which the open loop gain of the feedback control system becomes 0 dB. In this manner, the automatic gain adjustment device capable of accurately adjusting the gain can be realized with a simple structure.

Further, according to the present invention, in an automatic gain adjustment method of a feedback control system which uses a phase difference between an output signal obtained from a controlled object and an input signal while controlling the object based on the input signal, a phase shift amount is set such that a frequency of the input signal coincides with a crossover frequency at which an open loop gain forming the feedback control system becomes 0 dB, and a phase of the input signal is shifted based on the phase shift amount, thereby causing a frequency of the input signal to automatically coincide with the crossover frequency at which the open loop gain of the feedback control system becomes 0 dB. In this manner, the automatic gain adjustment method capable of accurately adjusting the gain can be realized with a simple structure.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An automatic gain adjustment device of a feedback control system that uses a phase difference between an output signal obtained from a controlled object and an input signal while controlling the object based on the input signal, the automatic gain adjustment device comprising:
   a disturbance generator for generating the input signal; the input signal being a sine wave of a predetermined frequency;
   phase shifting means connected to an input stage of the feedback control system for shifting a phase of the input signal such that a phase shift amount of the phase shifting means is set so that a frequency of the input signal to be supplied to a closed loop coincides with a crossover frequency at which an open loop gain of the feedback control system becomes 0 db;
   a band-pass filter for filtering the output signal to extract a component signal of the predetermined frequency;
   a multiplier for multiplying the phase-shifted input signal from the phase shifting means and the component signal from the band-pass filter;
   an integrator for integrating product results of the multiplier over one cycle at the predetermined frequency and outputting integrated product results; and
   a gain setting unit for adjusting a gain of the feedback control system based on a sign of the integrated product results from the integrator so that the open loop gain converges to 0 dB.

2. The automatic gain adjustment device according to claim 1, wherein the open loop gain is converged to 0 dB using a bisection method.

3. An automatic gain adjustment method for a feedback control system that uses a phase difference between an output signal obtained from a controlled object and an input signal while controlling the object based on the input signal, the automatic gain adjustment method comprising the steps of:
   generating the input signal using a disturbance generator; the input signal being a sine wave of a predetermined frequency;
   setting a phase shift amount so that a frequency of the input signal to be supplied to a closed loop coincides with a crossover frequency at which an open loop gain of the feedback control system becomes 0 dB;

shifting a phase of the input signal based on the phase shift amount set in said step of setting;

band-pass filtering the output signal to extract a component signal of the predetermined frequency;

multiplying the phase-shifted input signal and the component signal;

integrating product results of the multiplying step over one cycle at the predetermined frequency; and adjusting a gain of the feedback control system based on a sign of the integrated product results so that the open loop gain converges to 0 dB.

4. The automatic gain adjustment method according to claim 3, wherein the open loop gain is converged to 0 dB using a bisection method.

* * * * *

UNITED STATES PATENT AND TRADEMARK OFFICE
CERTIFICATE OF CORRECTION

PATENT NO. : 7,321,801 B2
APPLICATION NO. : 10/813454
DATED : January 22, 2008
INVENTOR(S) : Yasushi Saito It is certified that error appears in the above-identified patent and that said Letters Patent is hereby corrected as shown below:

Column 2, line 14, "involves additional steps" should read --involves the additional step--;

Column 2, line 15, "frequency fc" should read --frequency fc.--;

Column 2, line 15, delete "from an actual mea-";

Column 2, line 16, delete "surement and the like previously.";

Column 12, line 18, delete "there has been described in connection with the";

Column 12, line 19, "invention, it" should read --invention have been described, it--.

Signed and Sealed this

Tenth Day of March, 2009

JOHN DOLL
*Acting Director of the United States Patent and Trademark Office*